United States Patent [19]

Kenny et al.

[11] Patent Number: 5,287,292
[45] Date of Patent: Feb. 15, 1994

[54] HEAT REGULATOR FOR INTEGRATED CIRCUITS

[75] Inventors: John D. Kenny, Sunnyvale; Emilia V. Lei, Union City, both of Calif.

[73] Assignee: Picopower Technology, Inc., San Jose, Calif.

[21] Appl. No.: 962,437

[22] Filed: Oct. 16, 1992

[51] Int. Cl.⁵ .................................................. G06F 15/20
[52] U.S. Cl. ..................................... 364/550; 364/557; 395/550
[58] Field of Search .................. 364/557, 550, 707; 395/550, 750; 361/98, 103, 106; 340/596

[56] References Cited

U.S. PATENT DOCUMENTS

| | | | |
|---|---|---|---|
| 4,137,563 | 1/1979 | Tsunoda | 395/550 |
| 4,204,249 | 5/1980 | Dye et al. | 395/750 |
| 4,317,180 | 2/1982 | Lies | 364/707 |
| 4,479,191 | 10/1984 | Nojima et al. | 364/707 |
| 4,823,290 | 4/1989 | Fasack et al. | 364/557 X |
| 4,823,292 | 4/1989 | Hillion | 364/707 |
| 4,851,987 | 7/1989 | Day | 364/707 X |
| 4,873,649 | 10/1989 | Grald et al. | 364/505 |
| 4,893,271 | 1/1990 | Davis et al. | 395/750 |
| 5,021,679 | 6/1991 | Fairbanks et al. | 364/707 X |
| 5,025,248 | 6/1991 | Bergeron | 340/596 |
| 5,025,387 | 6/1991 | Frane | 395/550 X |
| 5,142,684 | 8/1992 | Perry et al. | 364/707 X |
| 5,189,647 | 2/1993 | Suzuki et al. | 364/707 x |

*Primary Examiner*—Kevin J. Teska
*Attorney, Agent, or Firm*—Oblon, Spivak, McClelland, Maier & Neustadt

[57] ABSTRACT

The temperature of a circuit is monitored and controlled by accumulating an estimate of heat generated in the circuit, and decreasing heat generation in the circuit when necessary. A periodic sampling of the operating mode of the circuit, as determined by clock speed and bus cycle activity, is used to determine heat accumulation in the circuit. An up/down counter increments when the sampling shows an operating mode indicating heating of the circuit and decrements when the sampled mode indicates cooling of the circuit. The circuit is forced to cool if a count on the up/down counter reaches a programmable threshold. Cooling is accomplished by slowing the clock speed of the circuit.

15 Claims, 6 Drawing Sheets

SMPLHOT = 1 COUNTS UP
SMPLHOT = 0 COUNTS DOWN
HZ7 IS GENERATED BY HZG4/9
REGTHDSEL = REGULATION THRESHOLD SELECT
REGDLYSEL = REGULATION DELAY SELECT

HEAT REGULATOR FOR INTEGRATED CIRCUITS

BACKGROUND OF THE INVENTION

1. Field of the Invention

This invention relates to monitoring and controlling the temperature of an integrated circuit.

2. Description of Related Art

An integrated circuit operating at a constant fixed level of activity has an equilibrium temperature which is eventually reached. At equilibrium, the heat lost to the surroundings of the circuit on average equals the heat generated by the circuit. The temperature, therefore remains roughly constant. Unfortunately, the equilibrium temperature of an integrated circuit is often above the safe operating temperature and a cooling scheme is needed.

Many high performance microprocessor systems experience excessive heat buildup in the central processing units (CPU) due to high power dissipation. Conventional cooling schemes for these systems use either a cooling fan or a large heat sink. Cooling fans move air past the integrated circuits and thereby increase the heat loss from the integrated circuits to the surroundings. This lowers the equilibrium temperature. However, cooling fans are large (compared to the scale of an integrated circuit), consume power, and can be noisy. Heat sinks are also large, in addition to being expensive and less effective. In portable computers where size and power consumption are critical, neither fans nor heat sinks are practical.

The temperature of a CMOS integrated circuit depends on the power used by the integrated circuit which is proportional to the clock speed or frequency of operation of the integrated circuit. Prior art power control schemes can change clock speed and therefore change circuit temperature. However, existing power control schemes are aimed at preserving battery power in devices such as portable computers and not at monitoring integrated circuit temperature. Any effect of such power saving circuitry on temperature is coincidental and ineffective at limiting worse case heat buildup.

SUMMARY OF THE INVENTION

Embodiments of the present invention regulate the temperature of an integrated circuit by forcing the regulated integrated circuit to cool when the temperature of the circuit gets too hot.

In one embodiment of the invention the temperature of an integrated circuit is regulated using a conventional temperature monitor and a novel power use regulator. The conventional temperature monitor might be a thermostat or a diode or any device with known temperature dependent characteristics. When the temperature monitor indicates that the temperature of an integrated circuit is too high the power use regulator would modulate the operating modes of the integrated circuit. For an example the power use regulator could restrict the ratio of the time that a CPU spends operating in high clock speed to the total time of operation so that the time operating at the high speed is reduced and the CPU cools.

In other embodiments of the invention the temperature of an integrated circuit is indirectly measured by monitoring the activity of the integrated circuit as a function of time and generating a figure of merit (called a temperature count) which is a measure of the temperature of the circuit.

In one embodiment, when the integrated circuit to be regulated is a CPU, a CPU clock sampler is used to monitor the CPU speed. The heat regulator circuit may or may not be implemented on the same integrated circuit as the CPU. If the CPU speed is fast (such as 33 MHz) it is read as "hot" or a 1; if the CPU speed is slow (such as 1 MHz) it is read as "cool" or a 0. The "hot" and "cool" samplings are averaged through an up/down counter. If the counter increments (i.e. measures the CPU speed to be "hot") more than it decrements (i.e. measures the CPU speed to be "cool"), the count will eventually reach a threshold value that will trigger regulation of the CPU speed. Whenever the threshold is reached, the CPU clock speed is slowed.

For example, if the CPU is running at 33 MHz for 30 seconds, a certain temperature, such as 50° C, will be reached. The actual values are experimentally determined. If the maximum temperature allowable for the CPU is set at 50° C. then the regulation threshold must be set so that 30 seconds of 33 MHz operation causes the up/down counter to increment to the threshold value. The CPU clock is then forced to slow down for a "cooling time" during which time the counter will then decrement and the CPU will cool.

The cooling time, for example, might be 100 milliseconds. While the circuit is cooling the temperature count on the up/down counter decreases since the regulator samples the clock speed as slow, or cool. After the cooling time is finished the CPU is then allowed to run at 33 MHz until the regulation threshold is again reached. Then the CPU is again forced to run at a slower clock rate. This cycle repeats throughout the operation of the circuitry.

As is apparent from the above description, the heat buildup in an integrated circuit is monitored by sampling the clocking frequency of the integrated circuit at regular time intervals. When the sampling indicates a high frequency, this indicates that the integrated circuit is generating too much heat and its temperature is increasing. The temperature count is correspondingly increased. When the sampling indicates a low frequency, this indicates that the integrated circuit's temperature is either cool or cooling, such that the temperature count is thereby decreased.

This method of monitoring and regulating temperature in an integrated circuit works because the heat generation in an integrated circuit is proportional to current flow, and current flow in a CMOS integrated circuit is directly proportional to the switching frequency of the circuit, commonly known as clock frequency. This indicates that heat generation is itself proportional to clock frequency.

Another embodiment of the invention includes the enhancement of monitoring the effective clock frequency of the external bus cycles in addition to the previously described scheme of monitoring only the core system clock. In many integrated circuits there are two significant parts of the circuit that operate at different frequencies. Generally there is a main system clock that clocks internal circuitry and there is a separate clock, or similar control mechanism, that clocks the output buffers of the integrated circuit. The current flow, and resultant heat generation, produced by the output buffers can be very large due to the fact that current flow is also directly proportional to load capacitance and output buffers typically drive significant capacitive loads. The specific equation defining this relationship is, $I = CV^2F$. Where I is current, C is capacitance, and F is frequency.

In a typical CMOS CPU it can be shown that the clock frequency of the internal circuitry accounts for approximately two thirds of the total current flow, whereas the effective clock frequency of the output buffers accounts for approximately one third of the total. If both factors are monitored simultaneously and the two factors are averaged in a weighted two to one ratio, an accurate assessment of the circuit's total current flow can be determined.

The output bus of a CPU is not driven by a fixed frequency clock. Instead the effective clock rate is determined by how frequently external bus cycles occur. In most computing systems the occurrence rate of bus cycles varies constantly depending upon what type of instructions the system software chooses to execute.

The effective clock frequency of the output bus can be determined, however, by randomly sampling external bus activity. Since each specific CPU type has a maximum possible frequency for its external bus cycles, the effective clock frequency can be estimated in proportion to the maximum. For instance, if a particular CPU has a maximum bus cycle frequency of 8 MHz, this equates to a maximum of one cycle every 125 nS. The present invention would then trigger a BUS ACTIVE signal for 125 nS immediately following the start of every bus cycle. This signal would remain high for 125 nS following the start of every bus cycle. After 125 nS the BUS ACTIVE signal would drop to low, unless a new bus cycle started. The BUS ACTIVE signal would then be sampled on a periodic basis. If the BUS ACTIVE signal is always found to be high, then there must be one bus cycle occurring every 125 nS in order to keep the BUS ACTIVE signal high, and this indicates a bus speed of 8 MHz. But if, for instance, only half of the BUS ACTIVE samples are found to be high, it can then be assumed that the effective bus clock frequency is only half of its maximum frequency or 4 MHz.

On a short term basis this type of periodic sampling could produce significant errors, but since the heat regulator's up/down counter averages large numbers of samples, and since the occurrence rate is a random phenomenon, the averaged result will be very accurate.

The up/down counter acts as both an averaging circuit and as a time delay element. Because the heat buildup in an integrated circuit is a relatively slow process, taking several minutes to reach its maximum heat, it is possible to allow the circuit to remain in a high heat generating state for several minutes before engaging active regulation to reduce the heat buildup. This delay is desirable because the heat regulator reduces heat by reducing the CPU's clock frequency which also has the undesirable effect of reducing system performance. It is preferable to delay active regulation until it is truly needed. This is achieved in the present invention by providing a programmable range of regulation delays.

Fortunately, this delay prevents the heat regulator from reducing performance under normal operating conditions, since normal operating conditions generally do not require that the CPU remain in a high heat generating state for more than a short period of time. In a typical computing system, short bursts of peak activity are separated by longer periods of relative inactivity. But since a computer system designer must design to the worst case scenario, the heat regulator becomes a very effective means of reducing the worst case heat condition without reducing system performance under normal operating conditions.

Another programmable variable provided for in the present invention is the power use ratio. In general, the power use ratio can be set at any value desired by varying the rate at which the counter counts up for a "hot" sample or the rate at which the counter counts down for a "cool" sample. In the embodiment described below, the power use ratio is programmed to one of several options by selecting a clock frequency that controls the rate at which the counter decrements. The power use ratio serves both as a threshold that controls activation of circuit regulation and as a limitation of the operation of an integrated circuit once regulation is triggered.

Each power use ratio option is defined by a percentage of time that the integrated circuit operates at maximum possible power use. For example, a power use ratio of 66% indicates no more than 66% of the operating time is spent in high power mode. A power use ratio of 66% can be set by causing an up/down counter to increment once for every "hot" sample and decrement twice for every "cool" sample. At this setting the temperature count remains in equilibrium only if the time spent at maximum power use is 66% of the total operating time. It takes two "hot" samples for every "cool" sample to keep the counter stable at a constant value. If there were more than two "hot" samples for every "cool" sample then the temperature count of the up/down counter would have an aggregate increase over time. Conversely if there were any less than two hot samples for every cool sample then the temperature count of the up/down counter would have an aggregate decrease over time.

Similarly if the power use ratio were set at 75%, then it would take more than three "hot" samples for every "cool" sample in order for the up/down counter to have an aggregate increase in the temperature count. The result of this mechanism is that whenever the circuit being regulated is in a high heat generating mode for a greater percentage of time than that indicated by the power use ratio, the up/down counter has an increasing count indicating that temperature is increasing beyond the acceptable threshold. If the circuit continues this pattern for an extended period of time, the up/down counter will continue its aggregate incrementing until it reaches the preprogrammed regulation delay, whereupon active regulation will be engaged to slow the CPU clock and thereby cool the system.

When active regulation is engaged, the integrated circuit being regulated operates at the same percentage as indicated by the power use ratio. That is, if the power use ratio is set to 75% then active regulation forces the CPU clock to run at slow speed for an average of 25% of the time. This will then cool the circuit to a temperature corresponding to 75% high power use. The power use ratio thereby determines the average temperature at which the circuit under regulation operates.

Experiments with a particular system design would be performed to determine the appropriate values for the power use ratio and the regulation delay. Appropriate values will vary from circuit to circuit and from system to system, depending on such variables as the maximum clock frequency of the system and the heat dissipation characteristics of the system.

This invention has a major advantage over cooling fans and heat sinks in that it takes up no space since it would generally be implemented on an integrated circuit already present in the system. Even when an embodiment of the invention is implemented as an independent control circuit rather than implemented directly on the circuit to be regulated, the implementation can still be miniaturized to the scale of an integrated circuit, much smaller than fans or heat sinks. Moreover, this invention cools by decreasing overall system power consumption rather than by increasing overall system power consumption the way a fan does. Additionally the circuitry of this invention is silent whereas fans make noise. This invention also saves the cost of a cooling fan or heat sink since it is virtually free when implemented on an existing circuit.

Unlike known power saving schemes which have only coincidental effects on circuit temperature, and which do nothing to reduce worst case temperature the present invention specifically regulates temperature to reduce the worst case temperature condition without reducing system performance under normal operating conditions.

DETAILED DESCRIPTION OF THE PREFERRED EMBODIMENTS

Figure 1:
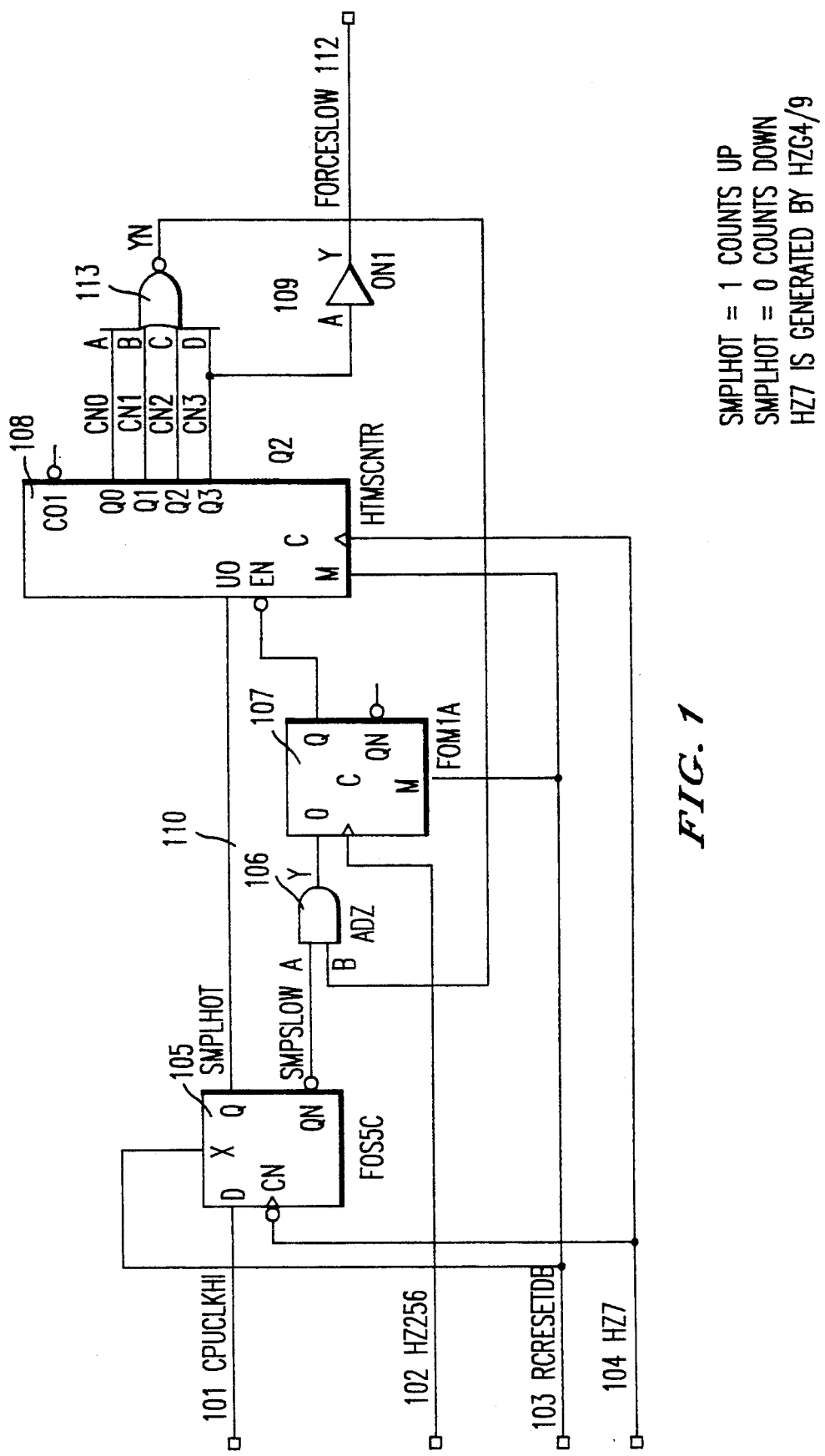
FIG. 1 is a circuit diagram of an embodiment of the invention where the invention is used to monitor CPU clock speed and control the speed according to a resulting temperature count.

FIG. 1 illustrates an embodiment of the invention which monitors CPU speed, accumulates a temperature count and slows the CPU when the temperature count indicates high temperature. A CPU clock sampler monitors the CPU speed. A CPU speed status line 101 reads as "hot" or one when the CPU is running fast (such as 33 Mhz), and "cool" or zero when the CPU is running slow (such as 1 Mhz). Naturally the logic employed could be reversed if desired so long as the remaining circuitry is adapted to work with the logic employed. The status line 101 is coupled to the data input of a D flip-flop 105. Flip-flop 105 samples the status line 101 at periodic intervals dependent on a timing signal 104 so that an output signal on lead 110 from flip-flop 105 indicates if the CPU was "hot" or "cool" when sampled.

The "hot" and "cool" signals are accumulated and averaged through an up/down counter 108. A counter clock signal on line 104 controls the rate at which counter 108 increments or decrements. In the circuit of FIG. 1, counter 108 increments or decrements once for every sampling of the CPU speed.

If counter 108 increments more than it decrements, the count in counter 108 will reach a threshold value. This threshold value will trigger temperature regulation by generating a signal on output line 112. The threshold value is set to a binary 1000 or a decimal 8. Whenever this threshold is reached, the output signal on lead 112 forces the CPU clock speed to slow. The slowing of the CPU clock causes a "cool" signal to appear on line 110 so counter 108 decrements during the next sampling interval. The CPU could then run "hot" in the following sampling interval causing counter 108 to count up to the threshold again and again generate a signal on lead 112 which forces the CPU to run slow again. In this manner after the threshold value is reached, the embodiment of the invention in FIG. 1 maintains no more than one time interval of CPU running "hot" for every interval of CPU running "cool." The ratio of time running "hot" to time running "cool" is approximately equal to or less than one.

When the circuit continually samples the clock as "cool" the up/down counter will continue decrementing until it reaches a minimum value of zero. If the count reaches zero and the clock speed is again sampled as "cool" then the counter will be prevented from decrementing further by NOR gate 113, AND gate 106, and flip-flop 107 which detect the zero count and disable the counter until the next "hot" sampling of the CPU clock.

The average operating temperature of a circuit regulated by the embodiment of FIG. 1 can be determined by experiment. One way to determine the effect of the circuit in FIG. 1 on the operating temperature of the integrated circuit is to measure the equilibrium temperature of the integrated circuit when the integrated circuit operates at constant high clock, and measure the operating temperature when the integrated circuit operates at constant low clock speed, then time average the equilibrium temperatures.

The circuit of FIG. 1 causes the CPU to operate with a variable operating frequency, so the operating temperature of the circuit will not be constant but will fluctuate around an average temperature. The averaged temperature equals a time average of the equilibrium temperatures for constant frequency operation, and is closely related to the power use ratio.

For example in a 486 system, when a CPU runs at 33 Mhz for a long period of time, the temperature of the CPU device might go up to 65 C in an open environment at room temperature where there is good air circulation. When the CPU runs at 1 MHz for a long time, the temperature might only be 28 C in an open environment. If the system is running at 33 Mhz for one interval, at 1 Mhz for the next interval, at 33 Mhz for the next interval, and continues this pattern, then the temperature of the system fluctuates around average temperature (65+28)/2 C, i.e. 46.5 C, assuming the surroundings are at room temperature.

The circuit in FIG. 1 has a power use ratio of 50% and restricts the CPU operation to keep the ratio of time running at high speed operation to time running at low speed operation to less than approximately 1. Accordingly, the temperature difference between the CPU and the surroundings will be regulated as described above. Using the example data, if the CPU is in an environment at room temperature, then the operating temperature will be about 46.5 C.

The temperature of the integrated circuit can be somewhat higher than the average for a short period of time. For example, if the counter starts at zero with the CPU already at the desired average temperature, such as 46.5 C, the CPU can run at high speed for 8 timing cycles causing the temperature to rise temporarily above average regulation temperature. A certain temperature (such as 48 C) is reached. The actual temperature can be experimentally determined. During this time, the counter increments once each timing cycle and reaches the threshold of 8. The CPU is forced to low speed for a timing cycle, and the counter decrements to 7. The temperature can go no higher since from that point on for every interval of high speed operation there must be an interval of low speed operation. The temperature trends back to the average regulation temperature, even though the temperature count remains near the threshold.

Figure 2A:
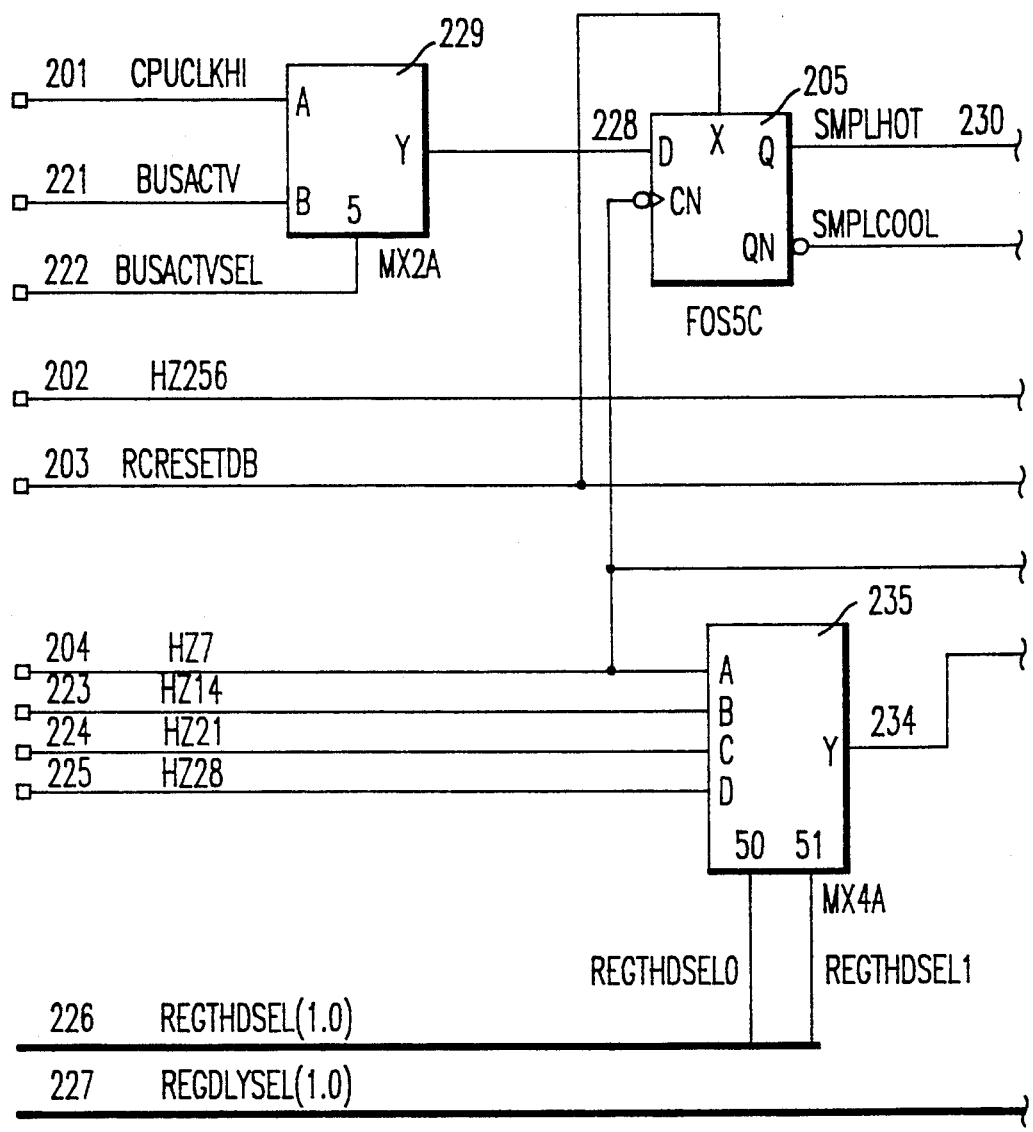
FIGS. 2A and 2B are circuit diagrams of an embodiment of the present invention which monitors both CPU clock speed and bus activity and controls the clock speed of the CPU to control temperature.
Figure 2B:
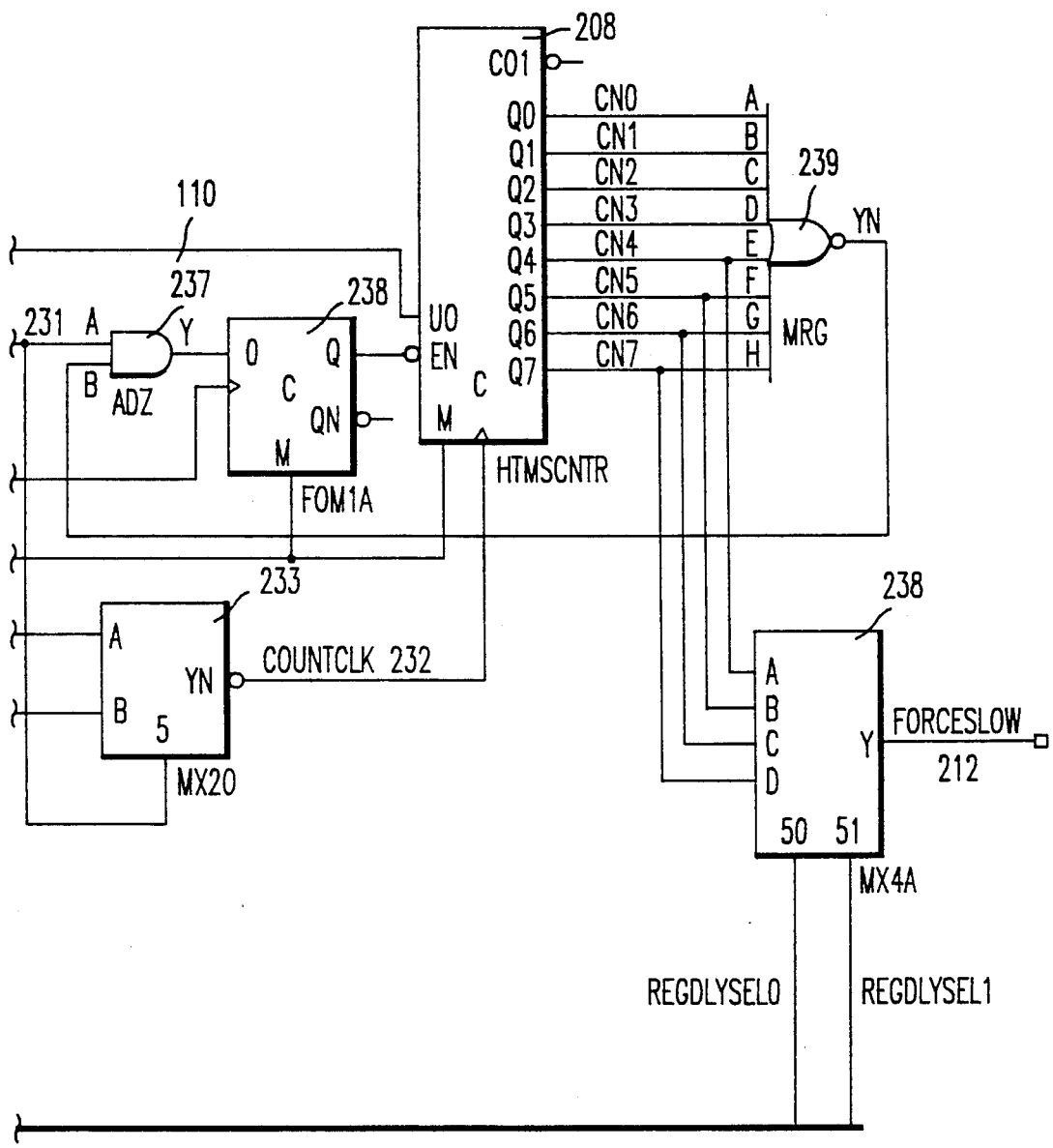

FIG. 2 shows an embodiment of the present invention that monitors both the CPU clock speed and bus activity. In FIG. 2, the CPU clock status line 201 is multiplexed with a bus active line 221. For a typical operation, a bus select signal BUSACTVSEL on line 222 has a 33% duty cycle (1:2 high to low ratio), and has a frequency that is one third of the frequency of the sampling timing signal on line 204. The signal indicates bus activity when high and clock speed when low.

If the signal BUSACTVSEL is low, the CPU status signal is sampled at output 228 of multiplexer 229. With a 33% duty cycle, the CPU is sampled ⅔ of the time and bus activity is sampled ⅓ of the time. The duty cycle can be changed to reflect the relative rates of heat generation by the bus verses the CPU.

Heat signals are carried on output lines 230 and 231 of flip-flop 205. A signal SMPLHOT on line 230 is high, indicating circuit heating, if the signal on lead 228 indicates the CPU was at high speed or bus was active when sampled. Otherwise the signal SMPLHOT is low indicating cooling of the circuit. A signal SMPLCOOL on line 231 is high if the circuit is cooling, and low if the circuit is heating.

Line 230 carries the signal SMPLHOT to an up/down input lead of a counter 208. The signal SMPLHOT determines whether the counter 208 counts up or counts down. A clock input lead of counter 208 is connected to an output of multiplexer 233 by line 232 so that the counter 208 is clocked by a signal COUNTCLK on the line 232. The multiplexer selects either a signal on line 204 or a signal on line 234 as the signal COUNTCLK. Line 231 is connected to the select input of multiplexer 233. The signal SMPLCOOL selects the clock signal on line 204 for incrementing of the counter 208. The signal on lead 234 is selected for decrementing the counter 208.

Multiplexer 235 selects one of several possible clock frequencies for decrementing the counter. The circuit in FIG. 2 can be set to four different power use ratios by changing the select signals on lines 226. As mentioned above the power use ratio that corresponds to a desired temperature depends on the constant frequency operating temperatures.

The temperature count held by the counter 208 is represented by signals on the counter output lines CN0–CN7. Multiplexer 236 selects one of several regulation delay options. As shown if FIG. 2 the regulation delay can be set to a trigger count of 16, 32, 64, or 128. If the temperature count reaches the trigger value, then a signal FORCESLOW on output lead 212 of multiplexer 236 goes high and forces the circuit to cool.

Devices 237, 238, and 239 stop the counter from decrementing when the counter value is 0.

Figure 3:
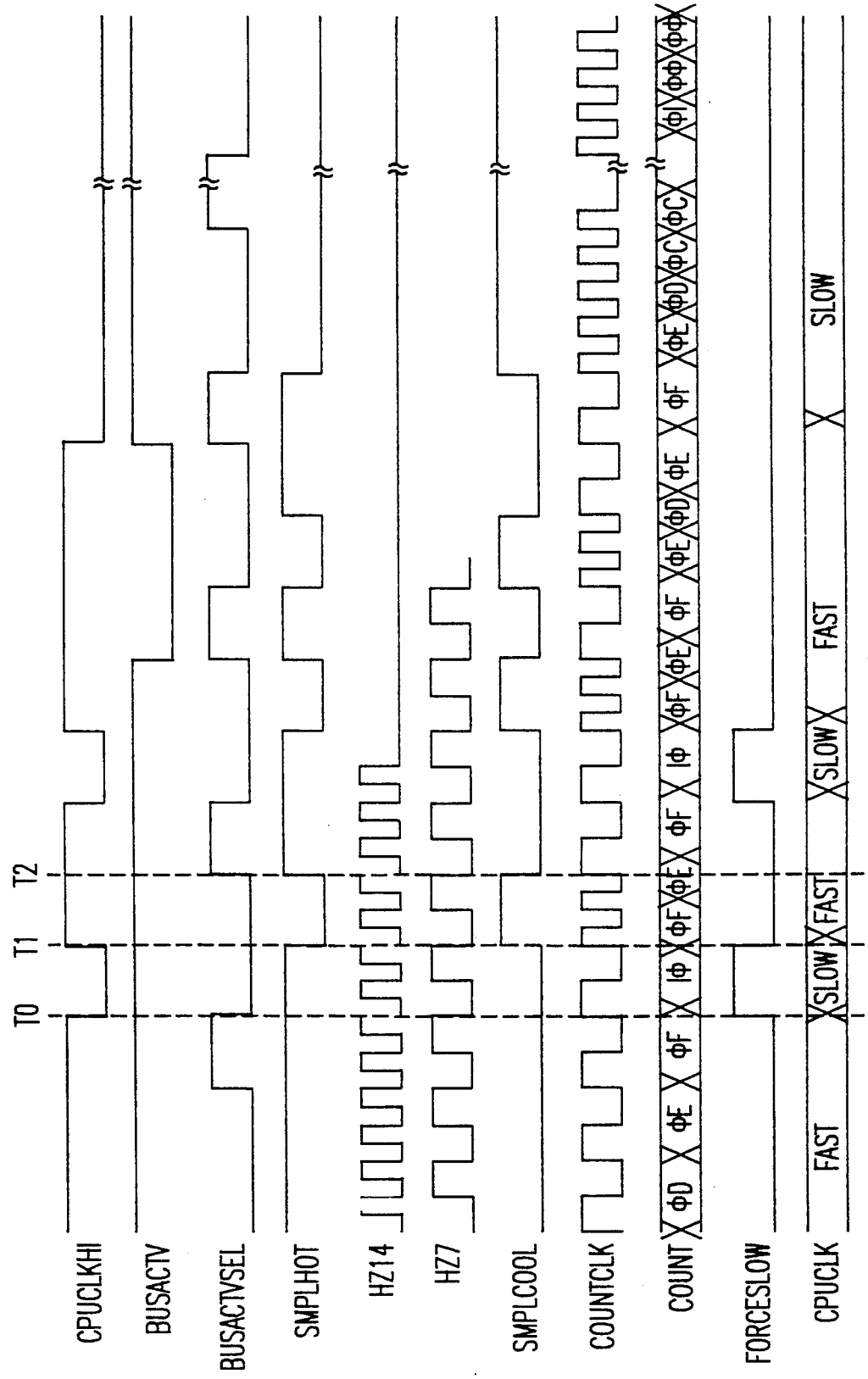
FIG. 3 is a timing diagram explaining the present invention as embodied in FIG. 2.

The operation of the circuit in FIG. 2 is illustrated in the timing diagram of FIG. 3. At the time T0, the bus select signal BUSACTVSEL is high and a bus active signal BUSACTV is sampled. The bus active signal BUSACTV is high indicating bus activity so the signal SMPLHOT is high and the signal SMPLCOOL is low. The signal SMPLHOT causes the counter 208 to count up. The signal SMPLCOOL on lead 231 selects a signal HZ7 on line 204 as the signal COUNTCLK on line 232.

The counter 208 counts up at the frequency of the signal COUNTCLK. The selected frequency is the same as sampling timing signal. Thus the counter 208 increments once before the next sampling, which occurs at time T1. The temperature count goes from 15 to 16 ($0F to $10 hexadecimal).

FIG. 3 is drawn assuming that the threshold value for the temperature count is 16, that is multiplexer 236 selects the signal on line CN4 as the signal FORCESLOW. The signal FORCESLOW on line 212 force the CPU to low speed operation.

At time T1 in FIG. 3, the bus select signal BUSACTVSEL is low indicating that CPU status is sampled. The CPU is operating at low clock speed as indicated by a signal CPUCLKHI being low. When the signal HZ7 clocks the D flip-flop 205 the signal SMPLHOT goes low and the signal SMPLCOOL goes high. The signal SMPLHOT causes the counter 208 to count down. The signal SMPLCOOL on lead 231 selects the signal from multiplexer 235 on line 234 as the signal COUNTCLK.

FIG. 3 is drawn under the assumption that multiplexer 235 selects a signal HZ14 that is twice as fast as the count up signal. The temperature count decrements twice during the time between T1 and T2 from 16 to 14 (10 to 0E hexadecimal). Because the temperature count is below the trigger value, the signal FORCESLOW goes low and the CPU is free to operate at high clock speed during the time between T1 an T2.

At time T2 in FIG. 3 the bus select signal 222 is still low so the CPU status signal CPUCLKHI is again sampled. Signal CPUCLKHI is high so SMPLHOT goes high, and SMPLCOOL is low. The counter 208 increments once during the sampling cycle. The difference at T2 being the temperature count only increments from 14 to 15 (0E to 0F hexadecimal) so the signal FORCESLOW remains low and the CPU is again free to operate at high clock speed.

As shown in FIGS. 2 and 3, the rate of decrementing the temperature count is twice the rate of incrementing. Accordingly, the power use ratio is 66%. If the circuit operates hot for 2 sampling intervals the counter increments twice, but if the circuit operates cool for one interval the counter decrements twice. If a two hot to one cool ratio is maintained then incrementing and decrementing cancels and the temperature count will not reach the trigger value. If on average the ratio of the increments to decrements is greater than two, then the temperature count will eventually trigger cooling. The cooling forces the ratio of time spent at high speed to time spent at low speed back to two.

The average temperature of the circuit can be calculated using the time average techniques described above. Using the example data, the average temperature should be $(65 \times 2 + 28 \times 1)/3$ C or about 52.7 C if the circuit is operating in a room temperature environment. The power use ratio and the average temperature changes if the select signal on lines 226 change. If for example the multiplexer 235 selected a signal HZ21 that had a frequency 3 time the incrementing frequency then the power use ration would be 75% and the average temperature would be $(65 \times 3 + 28 \times 1)/4$ C or about 54.8 C.

Figure 4:
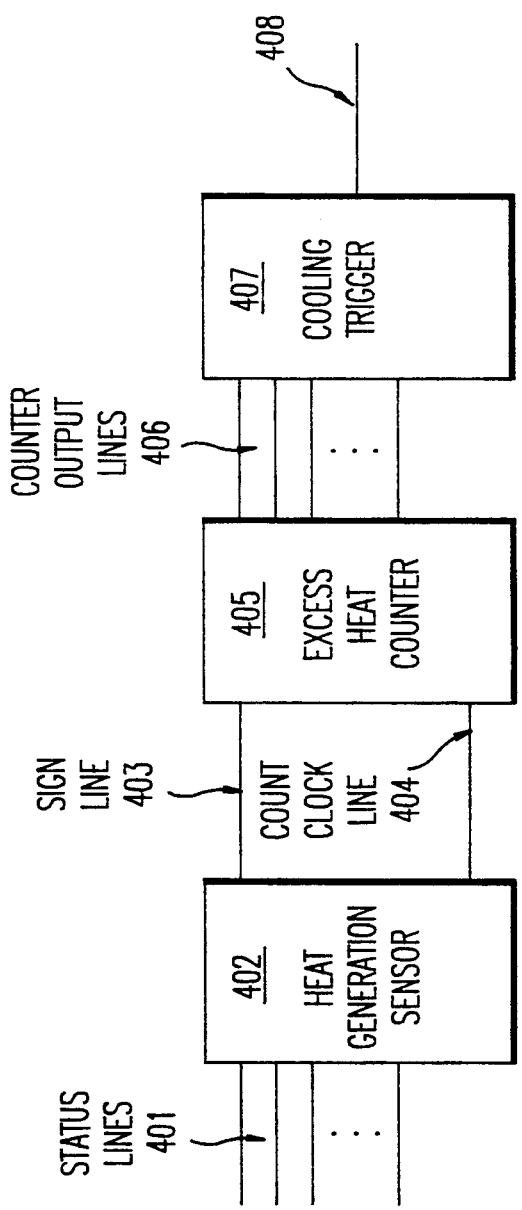
FIG. 4 is a block diagram of an embodiment of the invention capable of monitoring and controlling a circuit with a number of operating modes.

FIG. 4 shows an embodiment of the invention generalized to the case where the circuit to be controlled has a number of operating modes. Among other possibilities, these different operating modes may include a number of different frequencies at which the circuit could operate or a number of different elements which generate heat that needs to be monitored.

In FIG. 4, the current operating mode of the circuit is indicated by signals on the status lines 401. The heat generation sensor 402 senses the signals on the status lines 401 and generates a sign signal on sign line 403 and a count clock signal on line 404. The two signals are dependent on the status signals and change periodically as the status lines 401 are sampled. The sign signal on line 403 has a value that indicates either that the circuit generates more heat than it loses or that the circuit loses more heat than it generates. The count clock signal on line 404 has a frequency that is proportional to the net heat change in the circuit when the circuit operates in the sampled operating mode.

An excess heat counter 405 keeps a temperature count of the net heat generated in the circuit. The counter 405 is connected to the sign line 403 and the count clock line 404 so that the counter 403 counts up or down depending on the signal on the sign line 403 by an amount dependent on the frequency of the signal on count clock line 404. The excess heat counter 405 outputs a count signal on lines 406 indicating the temperature count.

The cooling trigger 407 senses the count signal on the counter output lines 406. If the count reaches a programmable trigger value, the cooling trigger 407 generates a cooling activation signal on line 408. This signal forces the circuit to cool. One way to force the circuit to cool is to reduce the clock speed of the circuit. Of course other cooling means could also be triggered such as fans or refrigeration.

Figure 5:
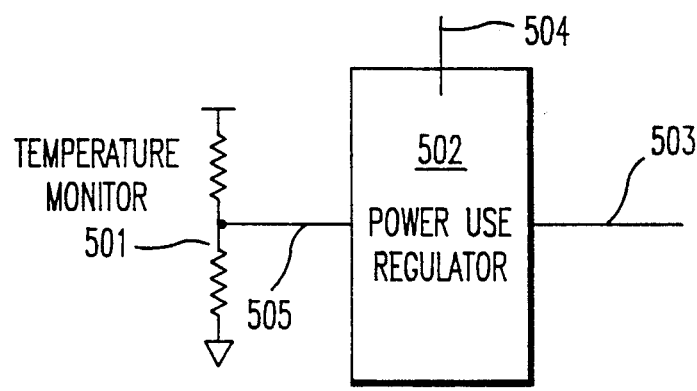
FIG. 5 shows an embodiment of the invention utilizing a conventional temperature monitor and a power use regulator.

Another embodiment of the invention might utilize a contentional temperature monitor and a novel power use regulator. FIG. 5 shows a block diagram for such an embodiment. In FIG. 5, a temperature dependent resistor 501 would be mounted near the circuit to be monitored. When the temperature as indicated by a signal on line 505 reached a trigger value the power use regulator 502 would activate. The power use regulator might simply force the integrated circuit to low clock speed operation as long as the temperature is high. Instead the power use regulator could comprise the circuits of FIGS. 2 or 3. The circuits would operate as long as the temperature monitor indicated high temperature, but would deactivate and reset when the temperature fell to an acceptable level.

Although the present invention has been described in detail, the description is only an illustration or example of the invention's application and should not be taken as a limitation. The scope of the present invention are limited only by the following claims.

We claim:

1. An apparatus for regulating a temperature of a circuit comprising:
   (a) a circuit activity monitor for providing a measure of the mode of operation of the circuit;
   (b) an excess heat counter coupled to the activity monitor for keeping a temperature count in response to the mode of operation of the circuit, the temperature count changing as a function of time at a rate selected to match net heat generation in the circuit at a desired temperature; and
   (c) a cooling trigger coupled to the excess heat counter, the cooling trigger causing the circuit to cool in response to the temperature count reaching a trigger value.

2. The apparatus of claim 1, wherein the cooling trigger comprises a device that sends a signal which forces the circuit being regulated to operate only in modes of operation which cause the circuit being regulated to cool toward a desired temperature.

3. The apparatus of claim 2, wherein the circuit activity monitor measures the mode of operation of the circuit by periodic sampling.

4. The apparatus of any of claim 1-3, wherein the excess heat counter comprises an up/down counter having a plurality of output leads, the plurality of output leads carrying signals which represent the temperature count.

5. The apparatus of claim 1, wherein the circuit includes a clock and wherein the circuit activity monitor comprises a means for periodically determining the speed of the clock in the circuit being regulated.

6. The apparatus of claim 1, wherein:
   (a) the circuit to be controlled comprises:
      (i) a CPU operable at a low clock speed and a high clock speed,
      (ii) a CPU clock speed status line which carries a signal indicating whether the CPU is running at the low clock speed or the high clock speed, and
      (iii) a set speed line for providing a control signal to the CPU to control the clock speed of the CPU, such that when a signal is asserted to the set speed line the CPU operates at the low speed;
   (b) the circuit activity monitor comprises a flip-flop with an input lead, an output lead, and a clock lead, the input lead being connected to the CPU clock speed status line, the clock lead being connectable to a sampling clock, the output lead carrying a heat signal that indicates the clock speed of the CPU when the flip-flop last clocked, the heat signal indicating either heating of the CPU or cooling of the CPU, where a high CPU clock speed on the CPU status line indicates heating and low CPU clock speed signal indicates cooling;
   (c) the excess heat counter comprises:
      (i) means for generating a count clock signal, and
      (ii) an up/down counter with a plurality of count output leads, an up/down input lead, and a clock input lead, the plurality of count output leads carrying signals which represent the temperature count, the up/down input lead being connected to the output lead of the flip-flop so that when the heat signal indicates heating the temperature count will change in one direction, and when the heat signal indicates cooling the counter output will change in the opposite direction, the clock input lead of the up/down counter being connected to the means for generating a count timing signal thereby allowing the means for generating a count timing signal to determine when the temperature count changes and the rate of the temperature count change;
   (d) the cooling trigger comprises a device with one or more input lead and an output lead, the one or more input leads of the device being connected to one or more of the plurality of output leads of the up/down counter, the output lead of the device being connected to the set speed line of the circuit so that the device can send a signal on the set speed line to force the circuit to low clock speed operation when the temperature count reaches the trigger value.

7. The apparatus of claim 6, wherein the means for generating a count clock signal comprises:
a multiplexer with a first input lead, a second input lead, a select lead, and an output lead, the first input lead being connectable to a first count clock operating at a first frequency, the second input lead being connectable to a second count clock operating at a second frequency, the select input lead being connected to an output lead of the flip-flop, the output lead of the multiplexer being connected to the clock lead of the up/down counter, the generated count clock signal being either a clock signal at the first frequency or a clock signal at the second frequency depending on the heat signal.

8. The apparatus of claim 1, wherein the circuit includes a CPU and a bus and the circuit activity monitor comprises means for periodically determining a clock speed of the CPU and periodically determining activity on said bus.

9. The apparatus of claim 8, wherein the excess heat counter comprises an up/down counter which changes depending on the clock speed of the CPU and the activity on said bus.

10. The apparatus of claim 9 further comprising:
adjusting means coupled to said CPU to adjust a clock signal supplied thereto; and
wherein the cooling trigger sends a signal to said adjusting means causing a slowing of said clock speed supplied to said CPU when the temperature count reaches the trigger value.

11. The apparatus of claim 1 wherein:
(a) the circuit comprises:
(i) a CPU operable at a low clock speed and a high clock speed,
(ii) a CPU clock speed status line which carries a signal indicating whether the CPU is currently running at the low clock speed or the high clock speed,
(iii) a set speed line for providing a control signal to the CPU to control the clock speed of the CPU, such that when a signal is asserted to the set speed line the CPU operates at the low speed,
(iv) a bus, and
(v) a bus activity line which carries a signal indicating the bus activity;
(b) the circuit activity monitor comprises:
(i) a multiplexer having a first signal input lead connected to the CPU clock status line, a second signal input lead connected to the bus activity line, a select input lead connectable a bus select timing clock, and an output lead for providing an output signal, the output signal being either the signal on the CPU clock status line or the signal on the bus activity line; and
(ii) a flip-flop with a data input lead connected to the output lead of the multiplexer, a clock input lead connectable to a sampling clock, and an output lead carrying a heat signal indicating either heating or cooling where high CPU clock speed or bus activity indicates heating;
(c) the excess heat counter comprises
(i) means for generating a count clock signal, and
(ii) an up/down counter with a plurality of output leads that carry signals which represent the temperature count, an up/down input lead connected to the output lead on the flip-flop so that when the heat signal indicates heating the up/down counter changes the temperature count in one direction, and when the heat signal indicates cooling the temperature count changes in the opposite direction, and a clock input lead connected to the means for generating a count timing signal thereby allowing the means for generating a count timing signal to determine when the counter output changes and the rate of the counter output change; and (d) the cooling trigger comprises a device with one or more input lead and an output lead, the one or more input leads of the device being connected to one or more of the plurality of output leads of the up/down counter, the output lead of the device being connected to the set speed line of the circuit so that the device can send a signal on the set speed line to force the circuit to low clock speed operation when the temperature count reaches the trigger value.

12. The apparatus of claim 11, wherein means for generating a count clock signal comprises:
a means for multiplexing clock signals having a plurality of input leads, a select lead, and an output lead, the plurality of input leads being connectable to a plurality of clocks which generate clock signals on the plurality of input leads, the output lead of the multiplexing means being connected to the clock lead of the up/down counter and carrying the count clock signal, the count clock signal being equal to a signal on one of the input leads.

13. A method for operating an integrated circuit comprising the steps of:
(a) determining temperatures of the integrated circuit that results when the circuit operates in various operating modes;
(b) limiting the amount of time that the integrated circuit spends operating in modes that result in temperatures higher than the desired operating temperature; and
limiting the ratio of the time that the circuit operates in a mode that results in temperature higher than the desired operating temperature to the time the circuit spends operating in a mode that results in temperatures lower than the desired temperature so that the ratio is not greater than a predetermined ratio that results in the desired temperature.

14. A method for controlling a temperature of a circuit operable in a plurality of modes, the method comprising the steps of:
(a) monitoring activity of said circuit by sampling the operating mode of said circuit;
(b) accumulating a temperature count by successive addition of values proportional to net heat that would be accumulated in the circuit if the circuit operated in the sampled operating mode at a desired temperature for the time between samplings,; and
(c) forcing the circuit to cool if the temperature count is equal to or greater than a trigger value.

15. The method of claim 14 wherein the circuit is forced to cool by forcing the circuit to operate for a time only in modes where the heat generated in the circuit is less than the heat lost to the surroundings at the desired operating temperature.

* * * * *